United States Patent
Otsuka

(10) Patent No.: US 10,763,077 B2
(45) Date of Patent: Sep. 1, 2020

(54) CHARGED PARTICLE BEAM APPARATUS AND IMAGE ACQUISITION METHOD

(71) Applicant: JEOL Ltd., Tokyo (JP)

(72) Inventor: Takeshi Otsuka, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/420,466

(22) Filed: May 23, 2019

(65) Prior Publication Data

US 2019/0362934 A1    Nov. 28, 2019

(30) Foreign Application Priority Data

May 24, 2018  (JP) ................................. 2018-099657

(51) Int. Cl.
| | |
|---|---|
| H01J 37/28 | (2006.01) |
| G06T 7/90 | (2017.01) |
| G01N 23/2251 | (2018.01) |
| H01J 37/22 | (2006.01) |

(52) U.S. Cl.
CPC .......... H01J 37/28 (2013.01); G01N 23/2251 (2013.01); G06T 7/90 (2017.01); H01J 37/222 (2013.01); *H01J 2237/24495* (2013.01); *H01J 2237/2814* (2013.01)

(58) Field of Classification Search
CPC .................... H01J 37/28; H01J 37/222; H01J 2237/24495; H01J 2237/2814; G06T 7/90; G01N 23/2251
See application file for complete search history.

(56) References Cited

U.S. PATENT DOCUMENTS

| | | |
|---|---|---|
| 5,001,344 A | 3/1991 | Kato et al. |
| 2013/0200255 A1 | 8/2013 | Schwarzband et al. |

FOREIGN PATENT DOCUMENTS

| | | |
|---|---|---|
| JP | 765775 A | 3/1995 |
| JP | 2004362087 A | 12/2004 |
| JP | 201841676 A | 3/2018 |

OTHER PUBLICATIONS

Extended European Search Report issued in EP19176244.2 dated Oct. 28, 2019.

*Primary Examiner* — Nicole M Ippolito
*Assistant Examiner* — Hanway Chang
(74) *Attorney, Agent, or Firm* — The Webb Law Firm

(57) ABSTRACT

A charged particle beam apparatus acquires a scanned image by scanning a sample with a charged particle beam and detecting charged particles emitted from the sample. The charged particle beam apparatus includes: a plurality of detection units that detect charged particles emitted from the sample; and an image processing unit that generates the scanned image based on a plurality of detection signals outputted from the plurality of detection units. The image processing unit performs a process of calculating a tilt direction of a sample surface and a tilt angle of the sample surface based on the plurality of detection signals for an irradiation position of the charged particle beam; and a process of determining a color of a pixel of the scanned image according to the calculated tilt direction and the calculated tilt angle.

7 Claims, 6 Drawing Sheets

CHARGED PARTICLE BEAM APPARATUS AND IMAGE ACQUISITION METHOD

CROSS-REFERENCE TO RELATED APPLICATION

This application claims priority to Japanese Patent Application No. 2018-099657 filed May 24, 2018, the disclosure of which is hereby incorporated by reference in its entirety.

BACKGROUND OF THE INVENTION

Field of the Invention

The present invention relates to a charged particle beam apparatus and an image acquisition method.

Description of Related Art

In a scanning electron microscope (an example of a charged particle beam apparatus), a SEM image can be obtained by scanning a sample with a finely focused electron beam and detecting electrons emitted from the sample due to the incidence of electrons. In a typical SEM image, the compositional contrast of a sample and the topographic contrast of the sample surface are mixed.

For example, JP-A-7-65775 discloses a scanning electron microscope provided with a backscattered electron detector in which two detection elements are disposed around a hole through which an electron beam passes. In this scanning electron microscope, an SEM image (compositional image) in which the composition of the sample is strongly reflected can be obtained by adding the signals of the two detection elements, and an SEM image (topographic image) in which the unevenness of the sample is strongly reflected can be obtained by subtracting the signals of the two detection elements.

When observing the composition of the sample with a scanning electron microscope, the signals of the two detection elements are added, as described above, to acquire a compositional image. However, even when the compositional image is acquired by adding the signals of the two detection elements, where the sample surface has uneven, the topographic contrast appears in the compositional image.

Therefore, for example, by making the sample surface flat and performing observation in a state in which the sample surface has no unevenness, the topographic contrast can be eliminated. However, in the scanning electron microscope, observation at the nanoscale is possible, and it is difficult to flatten the sample at the nanoscale.

Therefore, conventionally, when observing the composition of a sample, it has been necessary to capture the compositional image and the topographic image in the same viewing field, and to determine whether the contrast of the obtained compositional image is due to the composition or unevenness while comparing the compositional image with the topographic image.

SUMMARY OF THE INVENTION

The invention can provide a charged particle beam apparatus and an image acquisition method capable of acquiring a scanned image that enables easy discrimination of compositional contrast and topographic contrast.

According to a first aspect of the invention, there is provided a charged particle beam apparatus that acquires a scanned image by scanning a sample with a charged particle beam and detecting charged particles emitted from the sample, the charged particle beam apparatus including:

a plurality of detection units that detect charged particles emitted from the sample; and an image processing unit that generates the scanned image based on a plurality of detection signals outputted from the plurality of the detection units, the image processing unit performing:

a process of calculating a tilt direction of a sample surface and a tilt angle of the sample surface based on the plurality of the detection signals for an irradiation position of the charged particle beam; and a process of determining a color of a pixel of the scanned image based on the calculated tilt direction of the sample surface and the calculated tilt angle of the sample surface.

According to a second aspect of the invention, there is provided an image acquisition method used by a charged particle beam apparatus that acquires a scanned image by scanning a sample with a charged particle beam and detecting charged particles emitted from the sample with a plurality of detection units, the image acquisition method including:

calculating a tilt direction of a sample surface and a tilt angle of the sample surface based on a plurality of detection signals outputted from the plurality of the detection units for an irradiation position of the charged particle beam; and determining a color of a pixel of the scanned image based on the calculated tilt direction and the calculated tilt angle.

DESCRIPTION OF THE INVENTION

Figure 1:
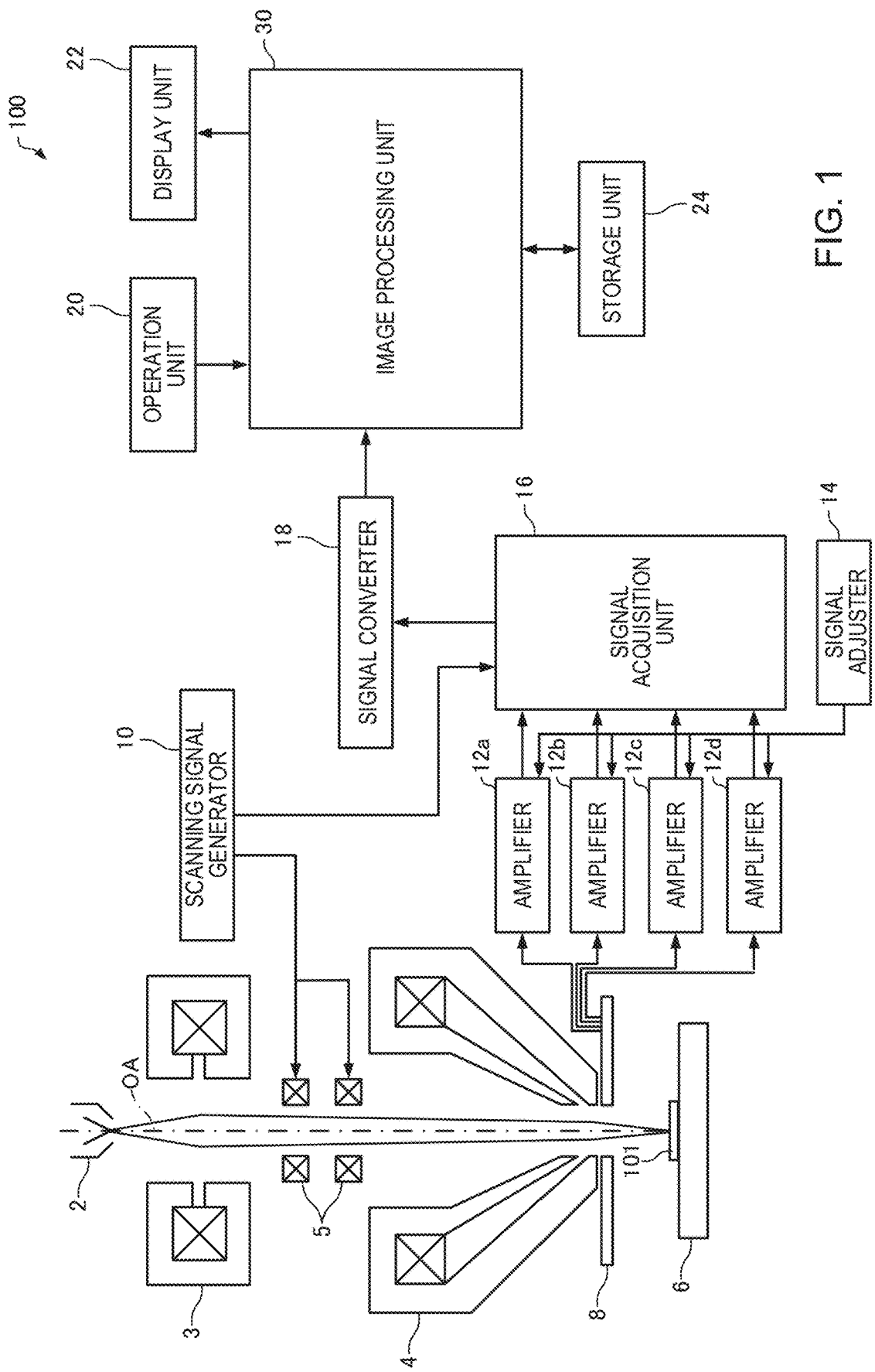
FIG. 1 illustrates a configuration of an electron microscope according to one embodiment of the invention.

According to one embodiment of the invention, there is provided a charged particle beam apparatus that acquires a scanned image by scanning a sample with a charged particle beam and detecting charged particles emitted from the sample, the charged particle beam apparatus including:

a plurality of detection units that detect charged particles emitted from the sample; and an image processing unit that generates the scanned image based on a plurality of detection signals outputted from the plurality of the detection units, the image processing unit performing:

a process of calculating a tilt direction of a sample surface and a tilt angle of the sample surface based on the plurality of the detection signals for an irradiation position of the charged particle beam; and a process of determining a color of a pixel of the scanned image based on the calculated tilt direction of the sample surface and the calculated tilt angle of the sample surface.

In such a charged particle beam apparatus, since it is possible to acquire a scanned image in which the unevenness of the sample surface is represented by color, the compositional contrast and the topographic contrast can be easily distinguished from each other.

According to one embodiment of the invention, there is provided an image acquisition method used by a charged particle beam apparatus that acquires a scanned image by scanning a sample with a charged particle beam and detecting charged particles emitted from the sample with a plurality of detection units, the image acquisition method including:

calculating a tilt direction of a sample surface and a tilt angle of the sample surface based on a plurality of detection signals outputted from the plurality of detection units for an irradiation position of the charged particle beam; and determining a color of a pixel of the scanned image based on the calculated tilt direction and the calculated tilt angle.

With such an image acquisition method, since it is possible to acquire a scanned image in which the unevenness of the sample surface is represented by color, the compositional contrast and the topographic contrast can be easily distinguished from each other.

Hereinafter, exemplary embodiments of the invention will be described in detail with reference to the drawings. Note that the embodiments described below do not unduly limit the contents of the invention disclosed in the claims. In addition, all of the elements described below are not necessarily essential requirements of the invention.

In the following, the charged particle beam apparatus according to the invention is exemplified by a scanning electron microscope that acquires a scanned image by irradiating with an electron beam and detecting electrons emitted from a sample. The charged particle beam apparatus according to the invention may be an apparatus that acquires a scanned image by irradiating with a charged particle beam (ion beam or the like) other than the electron beam and detecting charged particles emitted from the sample.

1. CONFIGURATION OF SCANNING ELECTRON MICROSCOPE

First, a scanning electron microscope according to one embodiment of the invention will be described with reference to the drawings. FIG. 1 illustrates a configuration of a scanning electron microscope 100 according to one embodiment of the invention.

The scanning electron microscope 100 scans a sample 101 with an electron beam and detects electrons emitted from the sample 101 to acquire a scanned image. As illustrated in FIG. 1, the scanning electron microscope 100 includes an electron source 2, a converging lens 3, an objective lens 4, a scanning deflector 5, a sample stage 6, an electron detector 8, a scanning signal generator 10, amplifiers 12a, 12b, 12c, 12d, a signal adjuster 14, a signal acquisition unit 16, a signal converter 18, an operation unit 20, a display unit 22, a storage unit 24, and an image processing unit 30.

The electron source 2 generates electrons. The electron source 2 is, for example, an electron gun that accelerates electrons emitted from a cathode by an anode and emits an electron beam.

The converging lens 3 and the objective lens 4 converge the electron beam emitted from the electron source 2 to form an electron probe. The diameter of the electron probe and the probe current (amount of irradiation current) can be controlled with the converging lens 3.

The objective lens 4 is disposed immediately in front of the sample 101 to form the electron probe. The objective lens 4 includes, for example, a coil and a yoke. In the objective lens 4, magnetic field lines formed by the coil are confined in the yoke made of a high-permeability material such as iron, and a notch is formed in a part of the yoke, whereby the magnetic lines distributed at high density are caused to leak on an optical axis OA.

The scanning deflector 5 deflects the electron probe (converged electron beam) formed by the converging lens 3 and the objective lens 4. The scanning deflector 5 is used to scan the sample 101 with the electron probe. The scanning deflector 5 is driven in response to a scanning signal generated by the scanning signal generator 10 to deflect the electron beam. As a result, the sample 101 can be scanned with the electron probe.

The sample 101 is placed on the sample stage 6. The sample stage 6 supports the sample 101. The sample stage 6 has a drive mechanism for moving the sample 101.

The electron detector 8 detects the electrons (for example, backscattered electrons) emitted from the sample 101 due to irradiation of the sample 101 with the electron beam. The electron detector 8 is, for example, a semiconductor detector. The electron detector 8 is disposed between the objective lens 4 and the sample stage 6.

Figure 2:
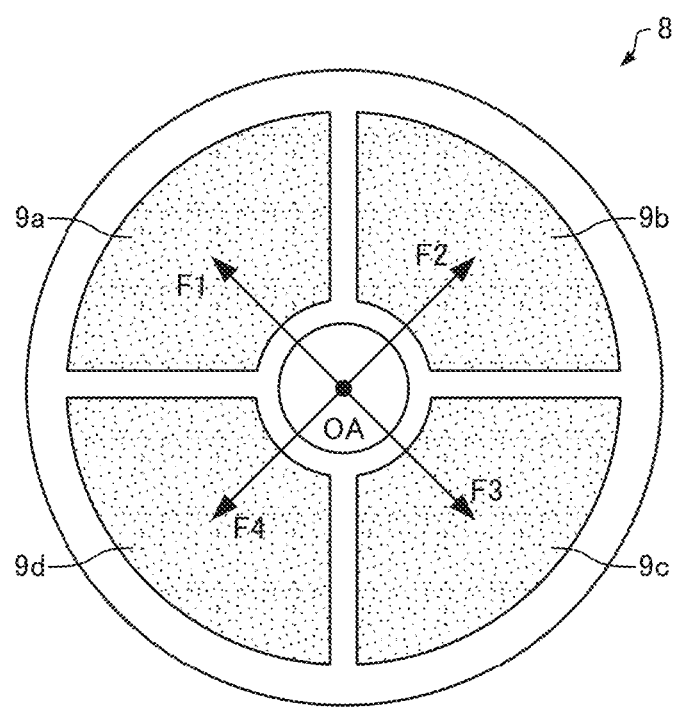
FIG. 2 is a plan view schematically illustrating an electron detector.

FIG. 2 is a plan view schematically illustrating the electron detector 8. As illustrated in FIG. 2, the electron detector 8 is a split detector having four detection areas (a first detection area 9a, a second detection area 9b, a third detection area 9c, and a fourth detection area 9d). The four detection areas 9a, 9b, 9c, 9d can detect electrons independently of one another. That is, each of the four detection areas 9a, 9b, 9c, 9d functions as a detection unit that outputs a detection signal of a signal amount corresponding to the amount of detected electrons. In the illustrated example, a first detection signal is outputted from the first detection area 9a, a second detection signal is outputted from the second detection area 9b, a third detection signal is outputted from the third detection area 9c, and a fourth detection signal is outputted from the fourth detection area 9d.

In the example illustrated in FIG. 2, the four detection areas 9a, 9b, 9c, 9d are formed by dividing the annular detection surface in the circumferential direction. The electron detector 8 is provided with a hole through which the electron beam passes. In the electron detector 8, the four detection areas 9a, 9b, 9c, 9d are arranged symmetrically with respect to the optical axis OA. The four detection areas 9a, 9b, 9c, 9d are arranged in a plane perpendicular to the optical axis OA. That is, the four detection areas 9a, 9b, 9c, 9d are arranged symmetrically with respect to the optical axis OA in a plane perpendicular to the optical axis OA. The areas of the four detection areas 9a, 9b, 9c, 9d are, for example, equal to one another.

The shape of the detector (detection surface) and the number of divisions are not limited to the example illustrated in FIG. 2. Further, instead of the split detector as the electron detector 8, a plurality of electron detectors each having a single detection area may be disposed. In this case, one electron detector constitutes one detection unit.

Further, in the example illustrated in FIG. 1, the electron detector 8 is disposed directly below the objective lens 4, but the position of the electron detector 8 is not particularly limited, provided that backscattered electrons emitted from the sample 101 can be detected.

For example, although not shown, in the case where a lens (so-called snorkel lens) having a resolution at a low acceleration voltage improved by actively generating the magnetic field of the lens up to the vicinity of the sample 101 is used as the objective lens 4 in the scanning electron microscope 100, the electron detector 8 may be disposed in the objective lens 4. This is because in this case, the electrons emitted from the sample 101 easily pass through the central hole of the objective lens 4 and reach the interior of the objective lens 4.

In the scanning electron microscope 100, the electron beam emitted from the electron source 2 is converged by the converging lens 3 and the objective lens 4 to form the electron probe, and the electron beam is deflected by the scanning deflector 5 to scan the sample 101 with the electron probe. As a result, electrons (for example, backscattered electrons) are emitted from the sample 101. The backscattered electrons emitted from the sample 101 are detected by the electron detector 8.

The detection signal outputted from the first detection area 9a is amplified by the amplifier 12a. The second detection signal outputted from the second detection area 9b is amplified by the amplifier 12b. The third detection signal outputted from the third detection area 9c is amplified by the amplifier 12c. The fourth detection signal outputted from the fourth detection area 9d is amplified by the amplifier 12d. The amplification factor and the offset amount of the detection signal in the amplifiers 12a, 12b, 12c, 12d are adjusted by the signal adjuster 14.

The signal acquisition unit 16 acquires the first to fourth detection signals amplified by the amplifiers 12a, 12b, 12c, 12d. Further, the signal acquisition unit 16 receives a scanning signal from the scanning signal generator 10 and acquires information on the irradiation position of the electron beam on the sample 101. In the signal acquisition unit 16, the first to fourth detection signals are associated with the information on the irradiation position of the electron beam. The signal acquisition unit 16 can be realized by, for example, a dedicated circuit.

The detection signal outputted from the signal acquisition unit 16 is converted by the signal converter 18 into a signal readable by the image processing unit 30.

The operation unit 20 performs the processing of converting an instruction from the user into a signal and sending the signal to the image processing unit 30. The operation unit 20 can be realized by, for example, an input device such as a button, a key, a touch panel display, or a microphone.

The display unit 22 outputs the image generated by the image processing unit 30. The display unit 22 can be realized by, for example, a display such as a liquid crystal display (LCD).

The storage unit 24 stores programs, data, and the like for the image processing unit 30 to perform various calculation processes. The storage unit 24 is also used as a work area of the image processing unit 30. The storage unit 24 can be realized by, for example, a random access memory (RAM), a read only memory (ROM), and a hard disk.

The image processing unit 30 generates a scanned image based on the first to fourth detection signals outputted from the four detection areas 9a, 9b, 9c, 9d.

Specifically, the image processing unit 30 performs a process of calculating a tilt direction of a sample surface and a tilt angle of the sample surface based on the first to fourth detection signals for each irradiation position of the electron beam; and a process of determining a color of a pixel of the scanned image based on the calculated tilt direction of the sample surface and the tilt angle of the sample surface. Further, the image processing unit 30 performs a process of determining the lightness of the pixel of the scanned image based on the sum total of the signal amounts of the first to fourth detection signals.

The functions of the image processing unit 30 can be realized by executing a program by various processors (central processing unit (CPU) or the like). At least a part of the functions of the image processing unit 30 may be realized by a dedicated circuit such as a gate array or the like (ASIC).

2. IMAGE ACQUISITION METHOD

Figure 3:
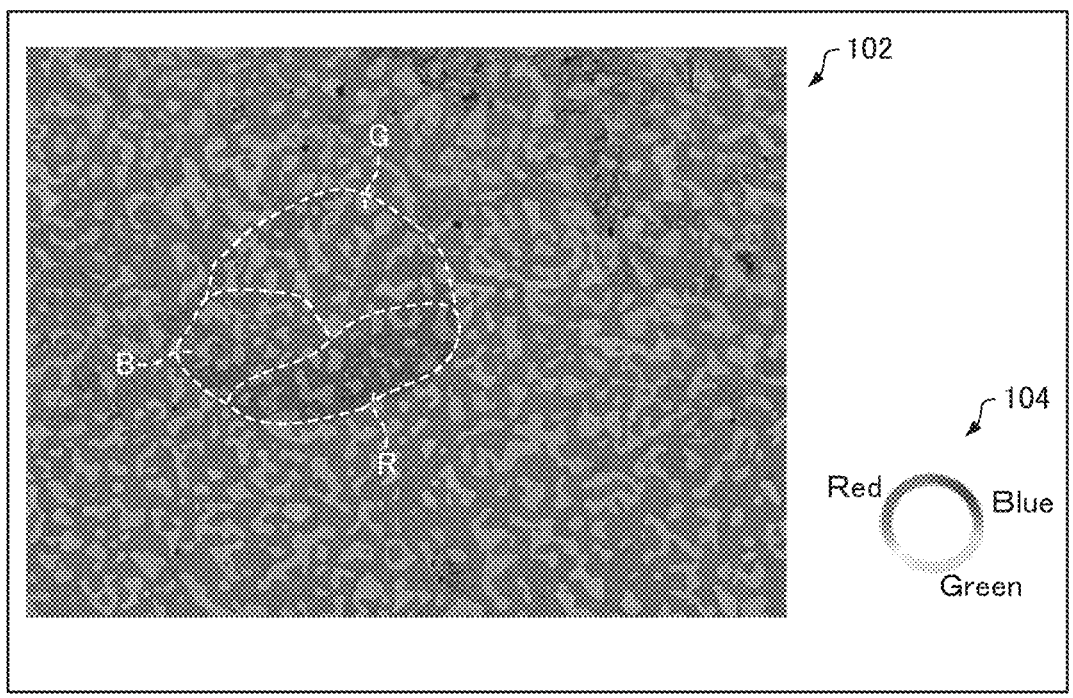
FIG. 3 illustrates an example of a scanned image generated by an image processing unit.

First, the scanned image generated by the image processing unit 30 will be described. FIG. 3 illustrates an example of a scanned image 102 generated by the image processing unit 30. In FIG. 3, a region R is a region of reddish color, a region G is a region of greenish color, and a region B is a region of bluish color. Further, in FIG. 3, for convenience, broken lines dividing the regions are drawn, but the hue changes continuously between adjacent regions.

In the scanned image 102 generated by the image processing unit 30, the tilt direction of the sample surface is represented by the hue H, the tilt angle of the sample surface is represented by the saturation S, and the sum total of the signal amounts of the first to fourth signals is represented by the lightness V.

In the scanned image 102, the tilt direction of the sample surface is represented by a hue circle 104 illustrated in FIG. 3. For example, a red pixel indicates that the sample surface is oriented in the direction indicated by red (Red) in the hue circle 104. Similarly, a green pixel indicates that the sample surface is oriented in the direction indicated by green (Green) in the hue circle 104, and a blue pixel indicates that the sample surface is oriented in the direction indicated by blue (Blue) in the hue circle 104. For example, in the scanned image 102 illustrated in FIG. 3, it can be confirmed from the region R, region G, and region B that the surface of the sample is recessed.

In the hue circle 104, the hues are arranged annularly. In the hue circle illustrated in FIG. 3, the hues are arranged continuously, but the hues may be arranged in 12 equal parts or 24 equal parts.

Figure 4:
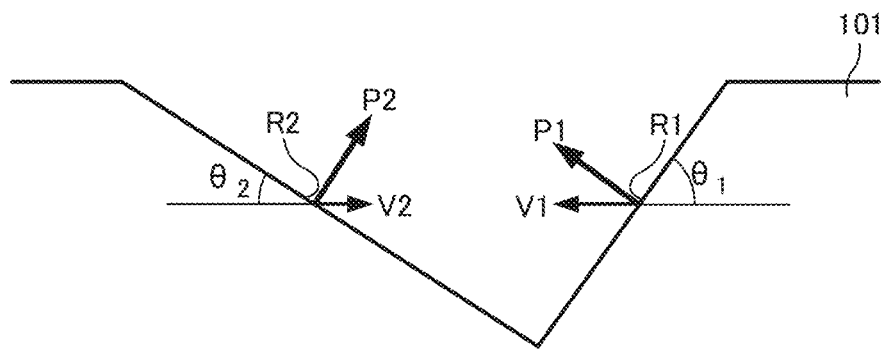
FIG. 4 is a diagram for explaining a scanned image.

FIG. 4 is a diagram for explaining the scanned image 102.

The tilt direction of the sample surface is the direction of the tilt of the sample surface. Specifically, the tilt direction of the sample surface is the direction of a component in the horizontal plane of the normal vector to the sample surface. The tilt direction of the sample surface corresponds to the direction of the shadow of an illumination effect. The illumination effect means that the SEM image has a contrast such as if light is falling from the detector direction.

In the example in FIG. 4, the tilt direction of the region R1 of the sample 101 is represented as the direction of a component V1 in the horizontal plane of a normal vector P1 to the region R1. In the scanned image 102, the hue H of the pixel corresponding to the region R1 is represented by the hue of the hue circle 104 corresponding to the direction of the component V1. Further, the tilt direction of the region R2 of the sample 101 is represented as the direction of a component V2 in the horizontal plane of a normal vector P2 to the region R2. In the scanned image 102, the hue H of the pixel corresponding to the region R2 is represented by the hue of the hue circle 104 corresponding to the direction of the component V2. In the example in FIG. 4, the direction of the component V1 and the direction of the component V2 are opposite to each other, so in the scanned image 102, the color of the pixel corresponding to the region R2 is complementary to the color of the pixel corresponding to the region R1.

In the scanned image 102, the larger the tilt angle of the sample surface, the larger the saturation S. The tilt angle of the sample surface corresponds to the intensity of the shadow of the illumination effect.

In the example in FIG. 4, the tilt angle $\theta_1$ of the region R1 is larger than the tilt angle $\theta_2$ of the region R2. Therefore, in the scanned image 102, the saturation S of the pixel corresponding to the region R1 is larger than the saturation S of the pixel corresponding to the region R2.

In the scanned image 102, the flat portion where the sample surface is not tilted is represented only by the lightness V. That is, in the scanned image 102, the flat portion of the sample surface is represented in gray scale as in a general SEM image. The lightness V of the pixels forming the scanned image 102 is represented, as described hereinbelow, as the sum total of signal amounts of detection signals of the four detection areas 9a, 9b, 9c, 9d. Therefore, the lightness V corresponds to the contrast of the compositional image.

As described above, by representing the tilt direction of the sample surface by the hue H and representing the tilt angle of the sample surface by the saturation S in a plurality of pixels constituting the scanned image 102, it is possible to confirm the unevenness of the sample surface as a change in color. Furthermore, in the scanned image 102, by representing the sum total of the signal amounts of the detection signals of the four detection areas 9a, 9b, 9c, 9d as the lightness V, it is possible to confirm the composition of the sample S as a change in lightness. Thus, the scanned image 104 is an image in which an image representing the unevenness as a change in color is superimposed on a compositional image represented in gray scale.

Next, a method for generating the scanned image 102 will be described. The scanned image 102 is generated by the image processing unit 30. The image processing unit 30 generates the scanned image 102 based on a first detection signal outputted from the first detection area 9a, a second detection signal outputted from the second detection area 9b, a third detection signal outputted from the third detection area 9c, and a fourth detection signal outputted from the fourth detection area 9d.

Figure 5:
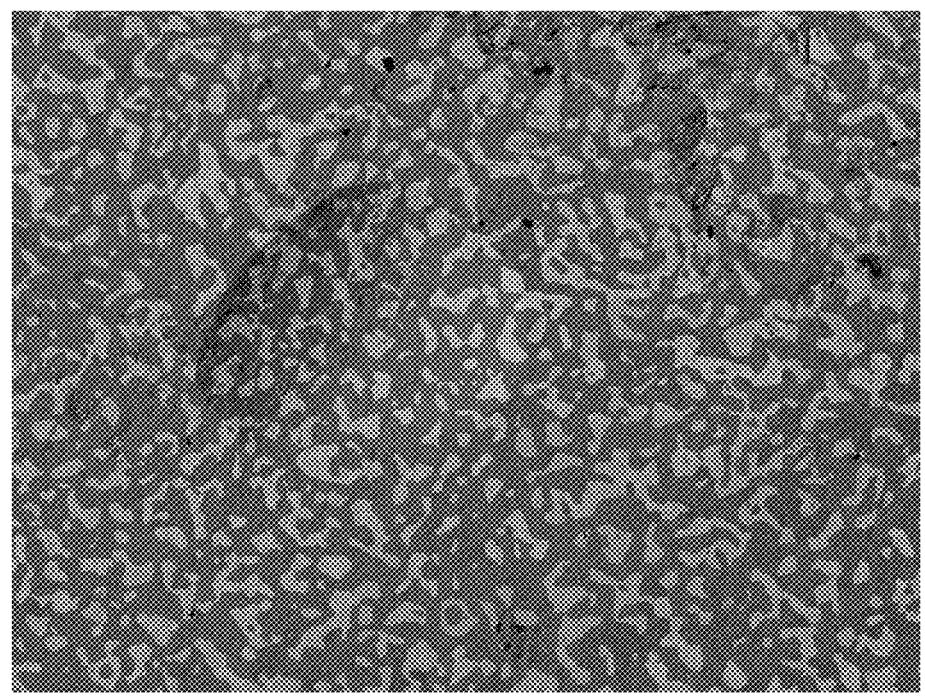
FIG. 5 is a SEM image generated by a first detection signal of a first detection area.
Figure 6:
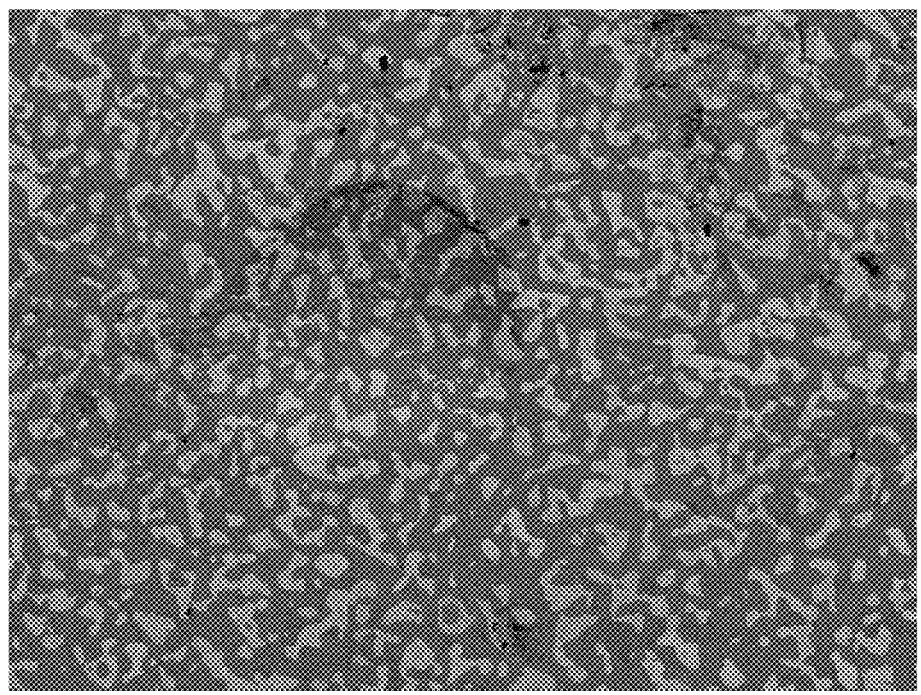
FIG. 6 is a SEM image generated by a second detection signal of a second detection area.
Figure 7:
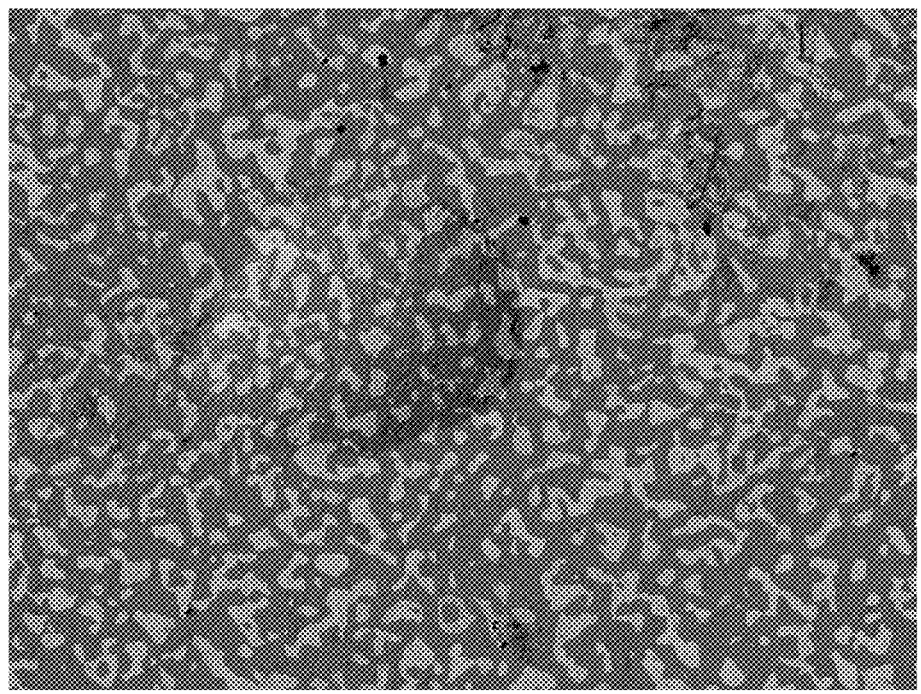
FIG. 7 is a SEM image generated by a third detection signal of a third detection area.
Figure 8:
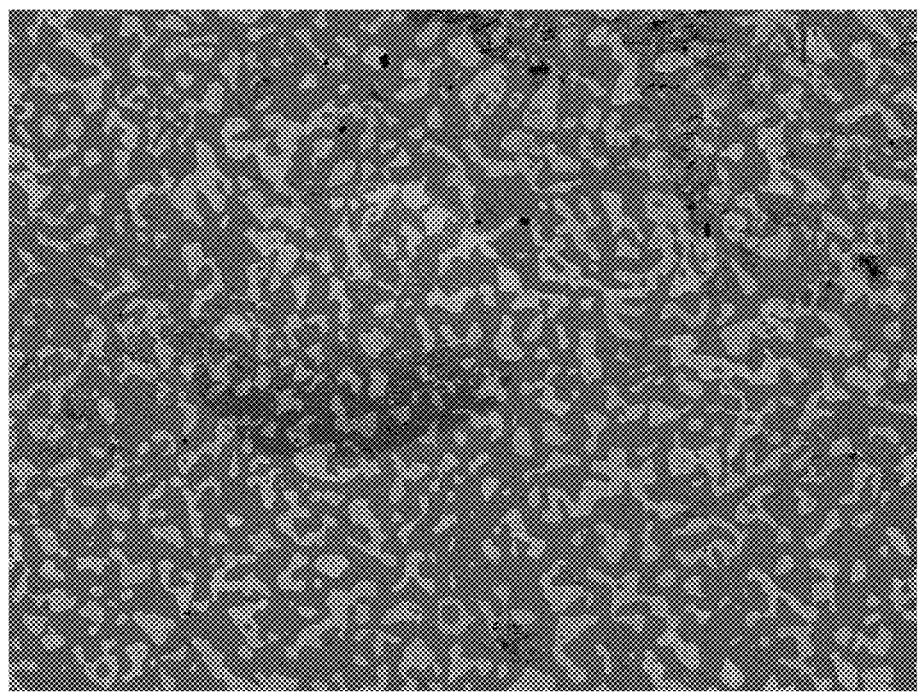
FIG. 8 is a SEM image generated by a fourth detection signal of a fourth detection area.

FIG. 5 is an SEM image generated by the first detection signal. FIG. 6 is an SEM image generated by the second detection signal. FIG. 7 is an SEM image generated by the third detection signal. FIG. 8 is an SEM image generated by the fourth detection signal.

When the four SEM images in FIG. 5 to FIG. 8 are compared, the compositional contrast is the same, but the topographic contrast is different. This is due to the illumination effect.

When the signal amount of the first detection signal is denoted by a, the signal amount of the second detection signal is denoted by b, the signal amount of the third detection signal is denoted by c, and the signal amount of the fourth detection signal is denoted by d, the hue H, the saturation S, and the lightness V of pixels of the scanned image 102 can be calculated using the following formulae.

$$H = \frac{1}{2\pi} \cdot \tan^{-1}\frac{b-d}{a-c}$$

$$S = \sqrt{(a-c)^2 + (b-d)^2}$$

$$V = a+b+c+d$$

Regarding the saturation S and the lightness V, the brightness and the color depth of the image can be adjusted by adjusting the values by adding a common coefficient or offset amount between pixels as shown by the following formulae.

$$S=\sqrt{(a-c)^2+(b-d)^2}+Os$$

$$V=(a+b+c+d)+Ov$$

Here, Os is the offset amount of the saturation S, and Ov is the offset amount of the lightness V.

The hue H, the saturation S, and the lightness V take values in the range of from 0 to 1.0, but when the values calculated for the saturation S and the lightness V using the above formulae become negative, 0 is used, and when the values are greater than 1.0, 1.0 is used.

In the scanning electron microscope 100, the orientation of the image can be changed according to the scanning direction of the electron beam (scan rotation). When the scanning direction of the electron beam is changed in the scanning electron microscope 100, the orientation of the electron detector 8 and the hue H will not match. In this case, the orientation can be matched by setting the hue H to a value in which the angle of the scanning direction of the electron beam is taken into account.

$$H = \frac{1}{2\pi} \cdot \tan^{-1}\frac{b-d}{a-c} + H0$$

For example, when the scanning direction of the electron beam is represented in radians as a scan angle ScanAngle, H0 is represented by the following formula.

$$H0 = \frac{ScanAngle}{2\pi}$$

However, if H>1.0, then H=H−1.0. Further, if H<0.0, then H=H+1.0. Thereby, the value of H can be fitted within the range of 0 to 1.0.

Described hereinabove is the case where the electron detector 8 has four detection areas 9a, 9b, 9c, 9d, but the number of detection areas in the electron detector 8 may be two or more, and preferably three or more.

3. PROCESSING

Next, processing in the image processing unit 30 will be described. In the following description, it is assumed that the scanned image is constituted by the first to m-th pixels represented as the g-th pixel (g=0, 1, 2, . . . , m−1), and the detection area is constituted by 0-th to (n−1)-th detection areas represented as k pixels (k=0, 1, 2, 3, . . . , n−1).

When the number of detection areas is taken as n, in the process of generating a scanned image, first, the signal amount of the detection signal is taken as the vector magnitude, the direction of the detection area with respect to the reference position is taken as the vector direction, and the sum of a plurality of vectors corresponding to the plurality of detection areas is determined. Then, the tilt angle of the sample surface, that is, the hue H of the pixel, is determined based on the direction of the sum, and the tilt angle of the sample surface, that is, the saturation S of the pixel, is determined based on the magnitude of the sum. A scanned image can be generated by performing these operations for all the pixels.

Here, the reference position can be set to an arbitrary position, and is, for example, the position of the optical axis OA in the plane in which the four detection areas 9a, 9b, 9c, 9d are arranged. In the example illustrated in FIG. 2, the directions of the four detection areas 9a, 9b, 9c, 9d, that is, the directions of the vectors, are represented by arrows F1, F2, F3, F4, respectively.

Figure 9:
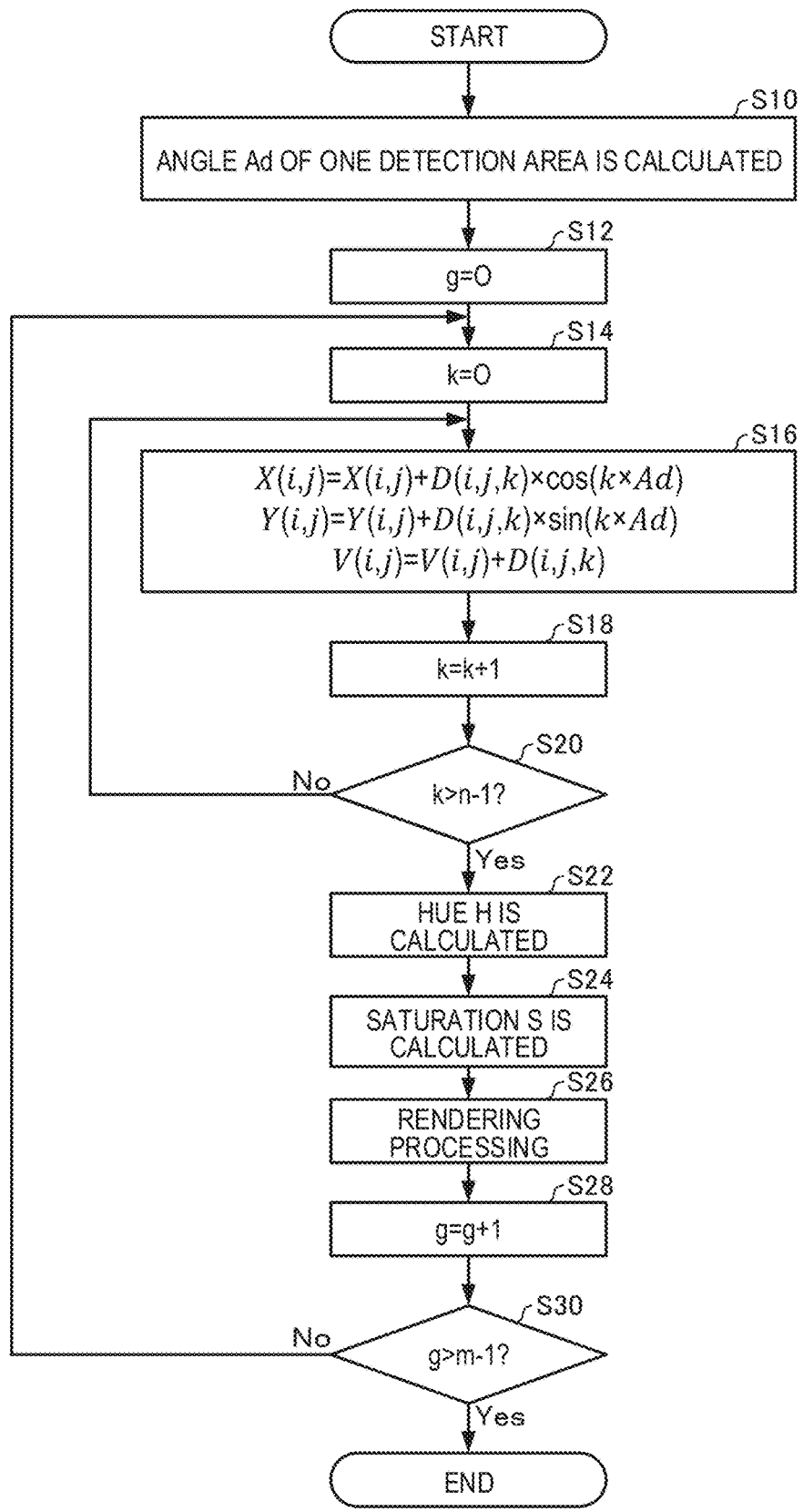
FIG. 9 is a flowchart illustrating an example of a process of generating a scanned image in an image processing device.

FIG. 9 is a flowchart illustrating an example of the process of generating a scanned image in the image processing unit 30.

First, an angle Ad for one detection area is obtained (S10). The angle for one detection area can be determined by $Ad = 2\pi/n$.

Next, assuming that g=0 (S12), the signal amount X(i,j) in the X direction, the signal amount Y(i,j) in the Y direction, and the sum total V(i,j) of the signal amounts are determined in the g-th pixel (i, j).

Specifically, first, assuming that k=0 (S14), the detection signal of the k-th detection area is acquired, and the signal amount X(i, j), the signal amount Y(i, j), and the sum total V(i, j) of signal amounts are calculated (S16) using the following formulae.

$$X(i,j) = X(i,j) + D(i,j,k) \times \cos(k \times Ad)$$

$$Y(i,j) = Y(i,j) + D(i,j,k) \times \sin(k \times Ad)$$

$$V(i,j) = V(i,j) + D(i,j,k)$$

Here, D(i, j, k) represents the signal amount of the detection signal detected in the k-th detection area at the irradiation position corresponding to the g-th pixel. When k=0, X(i, j), Y(i, j), and V(i, j) on the right side are zero.

Next, assuming that k=k+1 (S18), the signal amount X(i, j), the signal amount Y(i, j), and the sum total V(i, j) of the signal amounts are similarly calculated. This calculation is repeated until k>n−1 (S20). As a result, the signal amount X(i, j) in the X direction, the signal amount Y(i, j) in the Y direction, and the sum total V(i, j) of the signal amounts in the g-th pixel (g=0) can be determined.

Next, the hue H in the g-th pixel (g=0) is calculated (S22). The hue H of the g-th pixel (i, j) can be obtained by the following formula.

$$H = \tan^{-1} \frac{X(i, j)}{Y(i, j)}$$

Next, the saturation S in the g-th pixel (g=0) is calculated (S24). The saturation S of the g-th pixel (i, j) can be obtained by the following formula.

$$S = \sqrt{(X(i,j))^2 + (Y(i,j))^2}$$

Next, a process (rendering processing) of controlling the display unit 22 so that the area corresponding to the g-th pixel (g=0) is displayed with the determined hue H, saturation S, and lightness V in the display unit 22 is performed (S26). As a result, the area corresponding to the g-th pixel (g=0) of the display unit 22 is displayed with the determined hue H, saturation S, and lightness V.

Next, it is assumed that g=g+1 (S28), the processing returns to step S14, the signal amount X(i, j) in the X direction, the signal amount Y(i, j) in the Y direction and the sum total V(i, j) of the signal amounts in the g-th pixel (g=1) are similarly calculated (S14, S16, S18, S20, S22, S24), and the rendering processing (S26) is similarly performed. These processes are repeated until g>m−1 (S30).

By the above processing, the scanned image can be displayed on the display unit 22. In this way, a scanned image can be generated.

The process of generating the scanned image may be performed in parallel with the scanning of the electron beam. Thereby, for example, a scanned image of the sample can be confirmed in real time.

In addition, first, four SEM images in FIG. 5 to FIG. 8 are generated, and then information on the signal amounts a, b, c, d is acquired for each pixel from the four SEM images, and the same processing as the above-described processing illustrated in FIG. 9 is performed to generate a scanned image.

4. FEATURES

The scanning electron microscope 100 has, for example, the following features.

In the scanning electron microscope 100, the image processing unit 30 performs a process of calculating the tilt direction of the sample surface and the tilt angle of the sample surface based on the plurality of the detection signals for each irradiation position of the charged particle beam; and a process of determining the color of a pixel of the scanned image based on the calculated tilt direction of the sample surface and the tilt angle of the sample surface. Therefore, in the scanning electron microscope 100, since the scanned image in which the unevenness of the sample surface is represented by color can be acquired, the compositional contrast and the topographic contrast can be easily distinguished from each other.

In the scanning electron microscope 100, the image processing unit 30 performs a process of calculating the sum total of signal amounts of a plurality of detection signals, and represents the tilt direction of the sample surface as the hue H of the pixel, represents the tilt angle of the sample surface as the saturation S of the pixel, and represents the sum total of the signal amounts of the plurality of detection signals as the lightness V of the pixel. Therefore, in the scanned image generated by the image processing unit 30, the state of unevenness of the sample surface is represented as a change in hue H and saturation S, and the composition of the sample 101 is represented as a change in lightness V. Therefore, the compositional contrast and the topographic contrast can be easily distinguished from each other.

The scanning electron microscope 100 includes the display unit 22 that displays the image generated by the image processing unit 30, and the image processing unit 30 controls the display unit 22 to display the scanned image 102 and the hue circle 104 indicating the relationship between the tilt direction of the sample surface and the hue H. Therefore, in the scanning electron microscope 100, the tilt direction of the sample surface can be easily confirmed.

In the scanning electron microscope 100, the image processing unit 30 takes the signal amount of the detection signal as a vector magnitude, takes the position of the detection area as a vector direction, determines the sum of a plurality of vectors corresponding to a plurality of detection areas, determines the tilt direction of the sample surface based on the direction of the sum, and determines the tilt angle of the sample surface based on the magnitude of the sum. Therefore, in the scanning electron microscope 100, the hue H, the saturation S, and the lightness V of one pixel can be determined from the detection signal obtained at one irradiation position corresponding to the one pixel of the scanned image. Thus, in the scanning electron microscope 100, for example, scanning of an electron beam and generation of a scanned image can be performed in parallel. Therefore, in the scanning electron microscope 100, a scanned image in which the compositional contrast and the topographic contrast can be easily distinguished from each other can be acquired in a short time as in the case of a usual SEM image. Therefore, for example, in the scanning electron microscope 100, it is possible to acquire in real time a scanned image in which the compositional contrast and the topographic contrast can be easily distinguished from each other.

In the scanning electron microscope 100, the image processing unit 30 performs a process of calculating the tilt direction of the sample surface and the magnitude of the tilt angle of the sample surface and a process of determining the color of a pixel of the scanned image in parallel with the scanning of the electron beam. Therefore, in the scanning electron microscope 100, a scanned image in which the compositional contrast and the topographic contrast can be easily distinguished from each other can be acquired in a short time.

In the scanning electron microscope 100, since the plurality of the detection areas 9a, 9b, 9c, 9d are arranged symmetrically with respect to the optical axis OA, the calculation for determining the tilt direction of the sample surface and the tilt angle of the sample surface from detection signals can be simplified.

5. MODIFICATIONS

The invention is not limited to the above-described embodiments, and various modifications can be made within the scope of the invention.

For example, in the embodiments described above, in the scanned image, the tilt direction of the sample surface and the tilt angle of the sample surface are expressed by hue, saturation, and lightness, but for example, the tilt direction of the sample surface and the tilt angle of the sample surface may be expressed by RGB, CMYK or the like.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. A charged particle beam apparatus that acquires a scanned image by scanning a sample with a charged particle beam and detecting charged particles emitted from the sample, the charged particle beam apparatus comprising:

a plurality of detection units that detect charged particles emitted from the sample; and an image processing unit that generates the scanned image based on a plurality of detection signals outputted from the plurality of detection units, the image processing unit configured to:

calculate a tilt direction of a sample surface and a tilt angle of the sample surface based on the plurality of detection signals for an irradiation position of the charged particle beam; and determine a color of a pixel of the scanned image based on the calculated tilt direction of the sample surface and the calculated tilt angle of the sample surface.

2. The charged particle beam apparatus according to claim 1, wherein the image processing unit is further configured to calculate a sum total of signal amounts of the plurality of detection signals, the image processing unit represents the tilt direction as a hue of the pixel, represents the tilt angle as a saturation of the pixel, and represents the sum total of signal amounts of the plurality of detection signals as a lightness of the pixel.

3. The charged particle beam apparatus according to claim 2, further comprising:

a display unit that displays the image generated by the image processing unit, wherein the image processing unit is configured to cause the display unit to display the scanned image and a hue circle showing a relationship between the tilt direction and the hue.

4. The charged particle beam apparatus according to any claim 1, wherein in the process of calculating the tilt direction and the tilt angle, a sum of a plurality of vectors corresponding to the plurality of detection units is obtained by taking a signal amount of each of the detection signals as a vector magnitude and a direction of each of the detection units with respect to a reference position as a vector direction, and the tilt direction is determined based on the direction of the sum, and the tilt angle is determined based on the magnitude of the sum.

5. The charged particle beam apparatus according to claim 1, wherein the image processing unit is configured to calculate the tilt direction and the tilt angle and determine the color of the pixel in parallel with the scanning with the charged particle beam.

6. The charged particle beam apparatus according to claim 1, wherein the plurality of the detection units are arranged symmetrically with respect to an optical axis.

7. An image acquisition method used by a charged particle beam apparatus that acquires a scanned image by scanning a sample with a charged particle beam and detecting charged particles emitted from the sample with a plurality of detection units, the image acquisition method comprising:

calculating a tilt direction of a sample surface and a tilt angle of the sample surface based on a plurality of detection signals outputted from the plurality of detection units for an irradiation position of the charged particle beam; and determining a color of a pixel of the scanned image based on the calculated tilt direction and the calculated tilt angle.

* * * * *

UNITED STATES PATENT AND TRADEMARK OFFICE
CERTIFICATE OF CORRECTION

PATENT NO. : 10,763,077 B2  
APPLICATION NO. : 16/420466  
DATED : September 1, 2020  
INVENTOR(S) : Takeshi Otsuka Page 1 of 1

It is certified that error appears in the above-identified patent and that said Letters Patent is hereby corrected as shown below:

In the Claims

Column 12, Line 33, Claim 4, delete "to any" and insert -- to --

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*